United States Patent [19]

Gierisch et al.

[11] Patent Number: 4,782,033
[45] Date of Patent: Nov. 1, 1988

[54] PROCESS FOR PRODUCING CMOS HAVING DOPED POLYSILICON GATE BY OUTDIFFUSION OF BORON FROM IMPLANTED SILICIDE GATE

[75] Inventors: Heike Gierisch, Unterschleissheim; Franz Neppl, Munich, both of Fed. Rep. of Germany

[73] Assignee: Siemens Aktiengesellschaft, Berlin and Munich, Fed. Rep. of Germany

[21] Appl. No.: 928,893

[22] Filed: Nov. 10, 1986

[30] Foreign Application Priority Data

Nov. 27, 1985 [DE] Fed. Rep. of Germany ....... 3541940

[51] Int. Cl.$^4$ .......................................... H01L 21/265
[52] U.S. Cl. ...................................... 437/56; 437/200; 437/160; 437/45
[58] Field of Search ...................... 357/23.9, 23.12, 59; 29/571, 576 J, 591; 148/1.5, DIG. 34, DIG. 35; 437/40, 41, 56, 57, 160, 161, 200, 97, 44, 45

[56] References Cited

U.S. PATENT DOCUMENTS

| | | | |
|---|---|---|---|
| 4,180,596 | 12/1979 | Crowder et al. | 359/59 |
| 4,276,557 | 6/1981 | Levinstein et al. | 357/59 |
| 4,329,706 | 5/1982 | Crowder et al. | 357/59 |
| 4,443,930 | 4/1984 | Hwang et al. | 29/571 |
| 4,450,620 | 5/1984 | Fuls et al. | 29/571 |
| 4,525,378 | 6/1985 | Schwabe et al. | 427/38 |
| 4,555,842 | 12/1985 | Levinstein et al. | 29/571 |
| 4,593,454 | 6/1986 | Baudrant et al. | 29/591 |
| 4,640,844 | 2/1987 | Neppl et al. | 427/38 |

FOREIGN PATENT DOCUMENTS 0163871 11/1985 European Pat. Off.

OTHER PUBLICATIONS

*J. Vac. Sci. Technol.* B3(3) May/Jun. 1985, pp. 846–852, "Effect of Dopant Implantation on the Properties of TiSi$_2$/poly-si composites", by S. Vaidya et al.

Ghandhi, S. K., VLSI Fabrication Principles, John Wiley & Sons, 1983, pp. 420–427.

L. C. Parrillo et al., "A Fine-Line CMOS Technology That Uses P+-Polysilicon/Silicide Gates . . . ", IEDM Technical Digest 1984, pp. 418–422.

S. S. Wong et al., "Low Pressure Nitrided-Oxide as a Thin Gate Dielectric for MOSFET's", *J. Electrochem. Soc.*, vol. 130, No. 5, May 1983, pp. 1139–1144.

*Primary Examiner*—Brian E. Hearn
*Assistant Examiner*—T. N. Quach
*Attorney, Agent, or Firm*—Hill, Van Santen, Steadman & Simpson

[57] ABSTRACT

A process for the production of highly integrated circuits contaiining p- and n-channel MOS transistors including gate electrodes which consist of a doped double layer of polysilicon and metal silicide. The gates are doped with boron and are produced by diffusion from the metal silicide layer which has previously been doped with boron by ion implantation into the undoped polysilicon layer. The metal silicide layer preferably consisting of tantalum silicide is provided with a masking layer consisting of SiO$_2$, and the structuring of the boron-doped silicide gate and the masking layer is carried out after the boron atoms have been diffused in. The process serves to safely avoid undesired boron penetration effects which considerably influence the short channel properties of the transistors. The process is used for the production of CMOS-circuits having a high packing density.

7 Claims, 2 Drawing Sheets

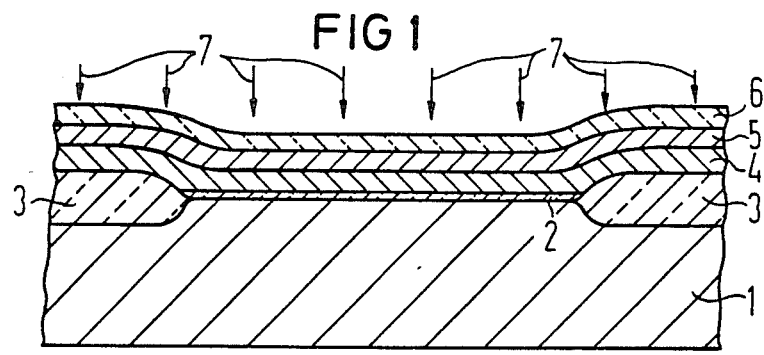
FIG 1
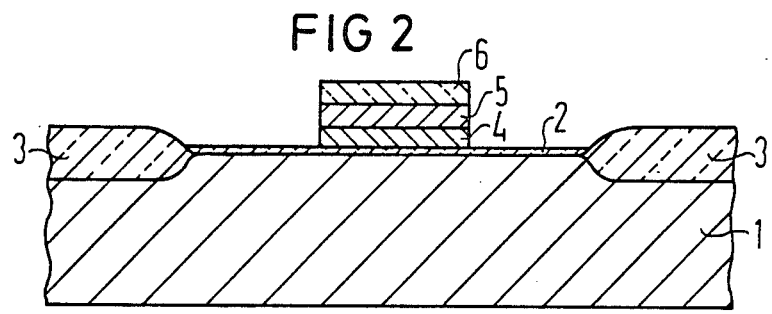
FIG 2
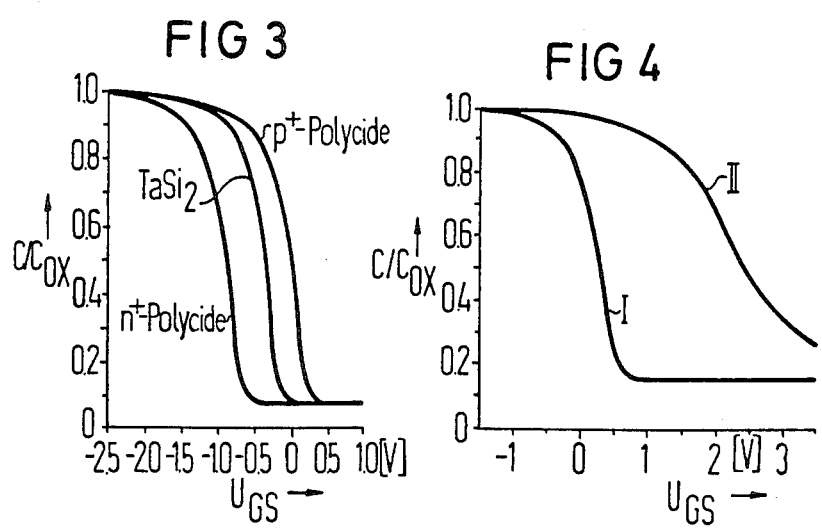
FIG 3
FIG 4

PROCESS FOR PRODUCING CMOS HAVING DOPED POLYSILICON GATE BY OUTDIFFUSION OF BORON FROM IMPLANTED SILICIDE GATE

BACKGROUND OF THE INVENTION

1. Field of the Invention

The present invention relates to the production of highly integrated circuits (CMOS) which contain p- and n-channel MOS transistors and gate electrodes consisting of double layers of metal silicides and polycrystalline silicon. The doping of the polycrystalline silicon layer is carried out by diffusion from the metal silicide layer.

2. Description of the Prior Art

Highly integrated circuits, wherein the gate electrodes consist of double layers of refractory metal silicides and polycrystalline silicon, and a process for their preparation, are disclosed, for example, in European Patent Application No. 0 163 871.

The continued increase in packing density and the resulting reduction in size of integrated circuits have added to the importance of short-channel effects in transistors. For example, such short-channel effects may be punch-through effects in the case of p-channel transistors or hot electron effects in the case of n-channel transistors. The doping conditions in the channel zone exert a substantial influence on the short-channel properties of the transistors.

Gate materials such as tantalum silicide or $p^+$-polycide which have a greater work function than $n^+$-polycide can be used to reduce the channel doping in the case of the n-channel transistor and the compensation in the channel zone in the case of the p-channel transistor while maintaining the threshold voltage. The term "polycide" refers to double layers consisting of a refractory metal silicide and polycrystalline silicon.

Short transistors having lengths of about 1 microns and good channel properties can be produced in this way. A lower compensation in the channel zone of the p-channel transistor reduces the punch-through effect due to the reduced space charge zone. The lower level of channel doping in the n-channel transistor reduces hot-electron such, for example, as the substrate current or the injection of charge carriers into the gate oxide and increases the mobility of the charge carriers. For further details of this effect, reference is invited to the article by Parrillo et al in the IEDM Tech. Digest, No. 15.6 (1984), pages 418 to 422. However, an impairment of the short channel properties occurs due to the lower level of channel doping.

In European Patent Application No. 0 135 163 there is disclosed a process for the production of highly integrated CMOS circuits wherein through the use of tantalum silicide as a gate material, a symmetrical threshold voltage of the n- and p-channel transistors having gate oxide thicknesses of about 20 nm amounting to approximately ±0.7 V can be obtained in a single, reduced channel implantation dose.

A further improvement in regard to the p-channel transistor can be obtained, as disclosed in the aforementioned European Patent Application No. 0 163 871 by the use of the $n^+$-polycide for the n-channel transistor and $p^+$-polycide for the p-channel transistor, involving no impairment of the n-channel transistor properties. Due to the difference of 1 V in the work function of the $p^+$-polycide as compared with the $n^+$-polycide, in the case of the p-channel transistor for gate oxide thicknesses of approximately 20 nm, the compensation of the channel zone can be entirely dispensed with so that the dependence of the threshold voltage upon the channel length becomes favorable similarly to that in the case of n-channel transistors with an $n^+$-polycide gate.

However, if both the short-channel properties of the p-channel transistor and the high breakdown voltage of the n-channel transistor are to be improved, and if the polysilicon/gate oxide boundary surface is to be retained, the use of $p^+$-polysilicon or $p^+$-polycide is advisable. However, under normal temperature loads in the CMOS process, $p^+$-polysilicon layers and $p^+$-polycide layers produced in accordace with known methods exhibit boron penetration effects unless expensive measures are taken, such, for example, as the use of nitrided gate oxide. Such a technique is described, for example, in an article by S. S. Wong et al in J. Electrochem. Soc. Vol. 130.5 (1983), pages 1139 to 1144.

SUMMARY OF THE INVENTION

The present invention seeks to provide a process for the production of highly integrated circuits containing p- and n-channel MOS transistors wherein the boron penetration which occurs under thermal stress and is caused by the use of standard boron-doped polycide gates is safely avoided. CMOS circuits are obtained which are optimum with regard to the short-channel properties of the p-channel transistors and the high voltage breakdown of the n-channel transistors.

This objective is obtained in a process of the type described, using the following process sequence, following the production of the gate oxide in the gate zone of the p- and n-channel transistors according to customary procedures:

(a) a layer consisting of undoped, polycrystalline silicon is deposited on the substrate surface which has been provided with a gate oxide layer,
(b) a metal silicide layer is applied thereto,
(c) the double layer consisting of polycrystalline silicon and metal silicide is provided with a layer which masks the subsequent source/drain implantation for the n-channel MOS transistors,
(d) boron atoms are introduced into the metal silicide layer by ion implantation over the entire surface thereof,
(e) a high-temperature treatment is carried out whereby the boron ions diffuse out of the metal silicide layer into the polycrystalline silicon layer, and the double layer is crystallized, and
(f) the double layer, with its masking layer, is structured to form gate electrodes following the use of a photo-resist technique.

The process conducted in accordance with the present invention provides a possibility of producing $p^+$-polycide gates which, after thermal treating which normally occurs in CMOS technology, exhibit no boron penetration effects.

Integration of the improved process into the standard CMOS process is achieved by three low-cost steps which do not require critical control, namely: (a) entire surface boron ion implantation, (b) deposition of a masking layer and (c) common structuring of the masking layer and the gate plane. The $p^+$-polycide and a reduced or omitted channel implantation allows threshold voltages of approximately ±0.7 V to be reached. At the same time, it is possible to improve the channel length dependence of the threshold voltage on the p- channel transistor, to reduce hot-electron effects in the n-channel transistor and to increase the effective mobility of the charge carriers.

In the preferred form of the present invention, tantalum silicide is used as the metal silicide and an $SiO_2$ layer is used as the masking layer. The $SiO_2$ is preferably produced by the thermal decomposition of tetraethylorthosilicate (TEOS) in a thickness of at least 100 nm. The polycide layer may consist of 100 nm undoped, polycrystalline silicon and 200 nm tantalum silicide.

The boron ion implantation can be carried out with a dosage of $5 \times 10^{15}$ cm$^{-2}$, and at an energy level of 40 keV. The high temperature treatment for diffusing the boron ions out of the metal silicide layer and into the polycrystalline silicon layer can take place at about 900° C. for a period of time ranging from about 1 hour to 2 hours.

BRIEF DESCRIPTION OF THE DRAWINGS

The portions of the CMOS process dealing with the process steps fundamental to the present invention and the results achieved thereby will be described in conjunction with the accompanying drawings in which:

FIGS. 1 and 2 are greatly enlarged cross-sectional views illustrating the essential process steps of the present invention;

FIG. 3 shows the dependence of C(U) on the various gate materials;

FIG. 4 illustrates the boron penetration in the case of p+-polysilicon;

DESCRIPTION OF THE PREFERRED EMBODIMENTS

Figure 5:
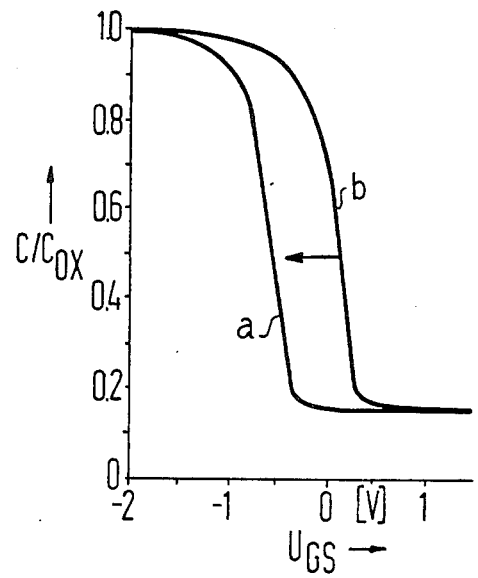
FIG. 5 illustrates the effect of the masking layer in relation to the phosphorus-source/drain implantation.

FIG. 1 shows the condition wherein the standard CMOS process has been carried out up to the formation of a gate oxide 2 measuring about 25 nm on a silicon substrate 1, and provided with field oxide zones 3. The channel implantation should be in accordance with the work function of the p+-polycide for the threshold voltage to be set. For forming the gate plane there is then deposited a layer 4 of about 100 nm thickness consisting of undoped polysilicon. Above this there is a 200 nm tantalum silicide layer 5 and a masking layer 6 which consists, for example, of silicon oxide and which screens the polycide 4, 5 from later phosphorus source/drain implantation in order to prevent redoping of the gate. The $SiO_2$ is preferably produced from the thermal decomposition of tetraethylorthosilicate for use as the masking layer 6. The oxide thickness of the masking layer above the polycide 4, 5 which in this example is 100 nm should be such that following the later deposition of any spacer layers, an oxide layer 6 of at least approximately 200 nm is left before n+-implantation. The boron ion implantation is then carried out into the tantalum silicide layer 5 over the entire surface as indicated by the arrow 7 with an energy and dosage level of, for example, 40 keV and $5 \times 10^{15}$ cm$^{-2}$, respectively. The subsequent tantalum silicide heat treatment at, for example, 900° C. for 1 to 2 hours, serves to dope the polycrystalline silicon layer 4 as a result of the diffusion of boron out of the tantalum silicide layer 5.

The p+-polycide 4, 5 produced in this manner is then structured as shown in FIG. 2 together with a masking layer 6 using a standard photo-resist technique (not illustrated) to form the gate electrode. First, the masking $SiO_2$ layer is etched by reactive ion etching in trifluoromethane and oxygen, and then the polycide is etched by a reactive ion etching in boron trichloride and chlorine. The remainder of the process then corresponds to a standard CMOS process.

As seen in FIG. 3, measurements carried out on MOS capacitors with a p+-polycide gate without channel implantation, due to the flat band voltage shift of approximately 1 V in the direction of more positive voltages in comparison to n+-polycide indicate that the doping described in FIGS. 1 and 2 of the polycrystalline silicon can be carried out up to the silicon/gate oxide interface. The C(U)-dependence for $TaSi_2$ has also been plotted by way of comparison. As in FIGS. 4 and 5, "C/Cox" means the differential MOS-capacitance normalized to the gate oxide capacitance Cox.

It will also be seen from FIG. 4 that in the case of p+-polycide produced by the process in accordance with the invention (curve I) in contrast to normal p+-polycrystalline silicon (curve II) no boron penetration effect occurs even after thermal stressing at 900° C. for 180 minutes.

FIG. 5 shows the influence of the masking layer during phosphorus-source/drain implantation on the flat band voltage of the MOS capacitor. Using only 100 nm silicon oxide from the thermal decomposition of tetraethylorthosilicate as a mask, as a result of redoping in the polycrystalline silicone an undesired flat band voltage shift in the direction of negative voltage (curve a) occurs which is not visible with a 200 nm thickness masking layer of the same material (curve b). This means that the influence of the phosphorus-source/drain implantation on the threshold voltage can be minimized.

Figure 6:
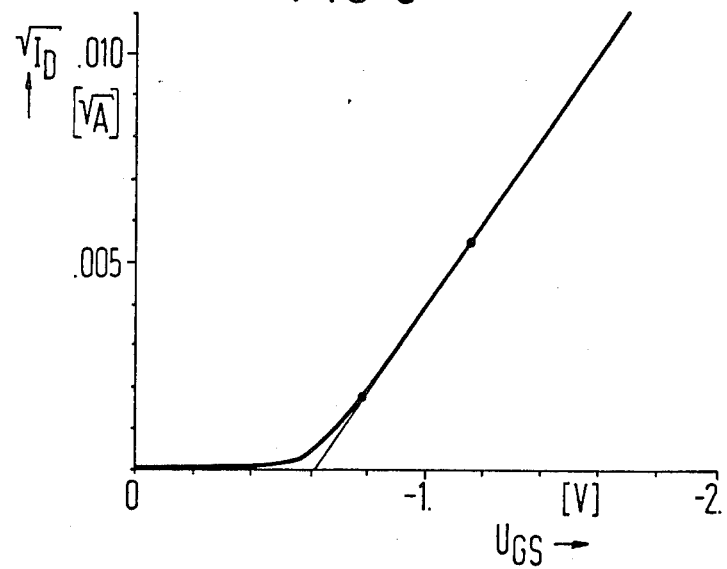
FIG. 6 shows the dependence of drain current upon the gate voltage $U_{GS}$ of a p-channel transistor in the case of p+-polycide.

FIG. 6 shows drain current ($I_{DS}$)-dependence of the p-channel transistor upon the gate voltage ($U_{GS}$). The ordinate plots the square root of the drain current ($\sqrt{A}$ means $\sqrt{amperes}$) in relation to the gate voltage $U_{GS}$. From this, the threshold voltage of the transistor can easily be determined. The threshold voltage determined for these transistors, without compensating channel implantation, amounts to about 0.6 V. $I_D$ is identical to $I_{DS}$.

It will be understood that various modifications can be made to the described embodiments without departing from the scope of the present invention.

We claim as our invention:

1. A process for the production of highly integrated circuits which p- and n-channel MOS transistors and gate electrodes consisting of double layers of a refractory metal silicide and polycrystalline silicon which comprises:
   providing a silicon substrate,
   forming gate oxide and field oxide layers on said substrate,
   depositing an undoped polycrystalline silicon layer over said gate oxide layer,
   applying a refractory metal silicide layer over said undoped polycrystalline silicon layer,
   applying a masking layer over the double layer of undoped polycrystalline silicon and refractory metal silicide, to thereby mask the source/drain implantation to be forme in the n-channel MOS transistors, introducing boron ions into said refractory metal silicide layer by ion implantation over the entire surface, subjecting the boron infiltrated material to a sufficiently high temperature and time to cause boron ions to diffuse out of the refractory metal silicide layer into said polycrystalline layer while causing crystalline of said double layer, and forming gate electrodes in said double layer through the use of said masking layer.

2. A process according to claim 1 wherein said refractory metal silicide is tantalum silicide.

3. A process according to claim 1 wherein said masking layer is composed of $SiO_2$.

4. A process according to claim 3 wherein said $SiO_2$ is the thermal decomposition product of tetraethylorthosilicate, and said masking layer has a thickness of at least 100 nm.

5. A process according to claim 1 wherein said double layer consists of a thickness of about 100 nm undoped polycrystalline silicon and a thickness of about 200 nm tantalum silicide.

6. A process according to claim 1 wherein the implantation of boron ions takes place at a dosage of about $5 \times 10^{15}$ cm$^{-2}$ and at an energy level of about 40 keV.

7. A process according to claim 1 wherein the high temperature treatment is carried out at a temperature of about 900° C. for a time of from 1 to 2 hours.

* * * * *